(12) United States Patent
Chu (10) Patent No.: US 11,137,013 B2
(45) Date of Patent: Oct. 5, 2021

(54) POWER SUPPLY AND SIGNAL TRANSMITTING DEVICE FOR SENSING BOLT AND SENSING BOLT DEVICE

(71) Applicant: CHINA PNEUMATIC CORPORATION, Taoyuan (TW)

(72) Inventor: Hsiu-Feng Chu, Taoyuan (TW)

(73) Assignee: China Pneumatic Corporation, Taoyuan (TW)

( * ) Notice: Subject to any disclaimer, the term of this patent is extended or adjusted under 35 U.S.C. 154(b) by 752 days.

(21) Appl. No.: 15/904,412

(22) Filed: Feb. 25, 2018

(65) Prior Publication Data

US 2018/0274579 A1 Sep. 27, 2018

(30) Foreign Application Priority Data

Mar. 24, 2017 (TW) .................. 106109855

(51) Int. Cl.
| | |
|---|---|
| *F16B 31/02* | (2006.01) |
| *H05K 7/14* | (2006.01) |
| *G01B 21/32* | (2006.01) |
| *F16B 37/14* | (2006.01) |
| *G01L 5/24* | (2006.01) |
| *H05K 1/18* | (2006.01) |

(52) U.S. Cl.
CPC ............ *F16B 31/025* (2013.01); *F16B 37/14* (2013.01); *G01B 21/32* (2013.01); *G01L 5/24* (2013.01); *H05K 7/1427* (2013.01); *G01B 2210/58* (2013.01); *H05K 1/18* (2013.01); *H05K 2201/10037* (2013.01); *H05K 2201/10151* (2013.01)

(58) Field of Classification Search
CPC ........ F16B 31/025; F16B 31/02; F16B 37/14; G01B 21/32; G01B 2210/58; H05K 7/1427; H05K 1/18; H05K 2201/10037
USPC ............................................... 411/14; 73/761
See application file for complete search history.

(56) References Cited

U.S. PATENT DOCUMENTS 4,114,428 A * 9/1978 Popenoe .................. G01B 7/22
  331/65
6,204,771 B1 * 3/2001 Ceney .................. F16B 31/025
  250/559.19
(Continued)

FOREIGN PATENT DOCUMENTS

CN 102607758 A 7/2012
TW 201435321 A 9/2014
(Continued)

*Primary Examiner* — Gary W Estremsky
(74) *Attorney, Agent, or Firm* — Wang Law Firm, Inc.

(57) ABSTRACT

A power supply and signal transmitting device for a sensing bolt and sensing bolt device is provided. The power supply and signal transmitting device, which is applied to the sensing bolt including a first contact set, includes a cap module and a supply module. The cap module caps one end of the sensing bolt and includes a cap circuit board module. A second contact set of the cap circuit board module contacts the first contact set for electrically connecting the sensing bolt. The supply module is interposed into the cap module for supplying an external power to the sensing bolt or accessing the data stored in the sensing bolt by electrically connecting a third contact set of the cap circuit board module with a fourth contact set of the supply module. Thereby, the power duration of the sensing bolt may be improved.

6 Claims, 9 Drawing Sheets

(56) References Cited

U.S. PATENT DOCUMENTS

| | | | | |
|---|---|---|---|---|
| 6,351,997 | B1* | 3/2002 | Loffler | F16B 31/02 73/761 |
| 6,501,211 | B1* | 12/2002 | Nasrollahzadeh | G01L 5/246 310/317 |
| 6,791,465 | B2* | 9/2004 | Blagin | F16B 41/005 340/539.1 |
| 7,263,895 | B2* | 9/2007 | Nagasaka | G01L 9/0051 73/715 |
| 7,412,898 | B1* | 8/2008 | Smith | G01L 5/24 73/761 |
| 8,024,980 | B2* | 9/2011 | Arms | G01L 5/24 73/763 |
| 8,596,134 | B2* | 12/2013 | Mekid | F16B 31/02 73/761 |
| 9,632,016 | B2* | 4/2017 | Hernandez | B25B 23/1425 |
| 9,746,017 | B2* | 8/2017 | Ota | G01C 19/56 |
| 9,915,574 | B2* | 3/2018 | George | G01L 5/0019 |
| 9,964,134 | B1* | 5/2018 | Tran | G01L 5/24 |
| 2010/0050778 | A1 | 3/2010 | Herley et al. | |
| 2013/0064622 | A1* | 3/2013 | Mekid | F16B 31/02 411/13 |

FOREIGN PATENT DOCUMENTS

| | | |
|---|---|---|
| TW | I454346 B | 10/2014 |
| TW | M500827 U | 5/2015 |
| TW | I569923 B | 2/2017 |

* cited by examiner

POWER SUPPLY AND SIGNAL TRANSMITTING DEVICE FOR SENSING BOLT AND SENSING BOLT DEVICE

CROSS-REFERENCE TO RELATED APPLICATION

This application claims priority from Taiwan Patent Application No. 106109855, filed on Mar. 24, 2017 at the Taiwan Intellectual Property Office, the content of which is hereby incorporated by reference in its entirety for all purposes.

BACKGROUND OF THE INVENTION

1. Field of the Invention

The present invention relates to the technical field of sensing bolts, and especially relates to a power supply and signal transmitting device and a sensing bolt device, which can lessen the persistency problem of the power supply of the sensing bolt and provide real-time and long-distance transmissions of sensing signals of the sensing bolt to monitor the tightening status of the sensing bolt.

2. Description of the Related Art

Figure 9:
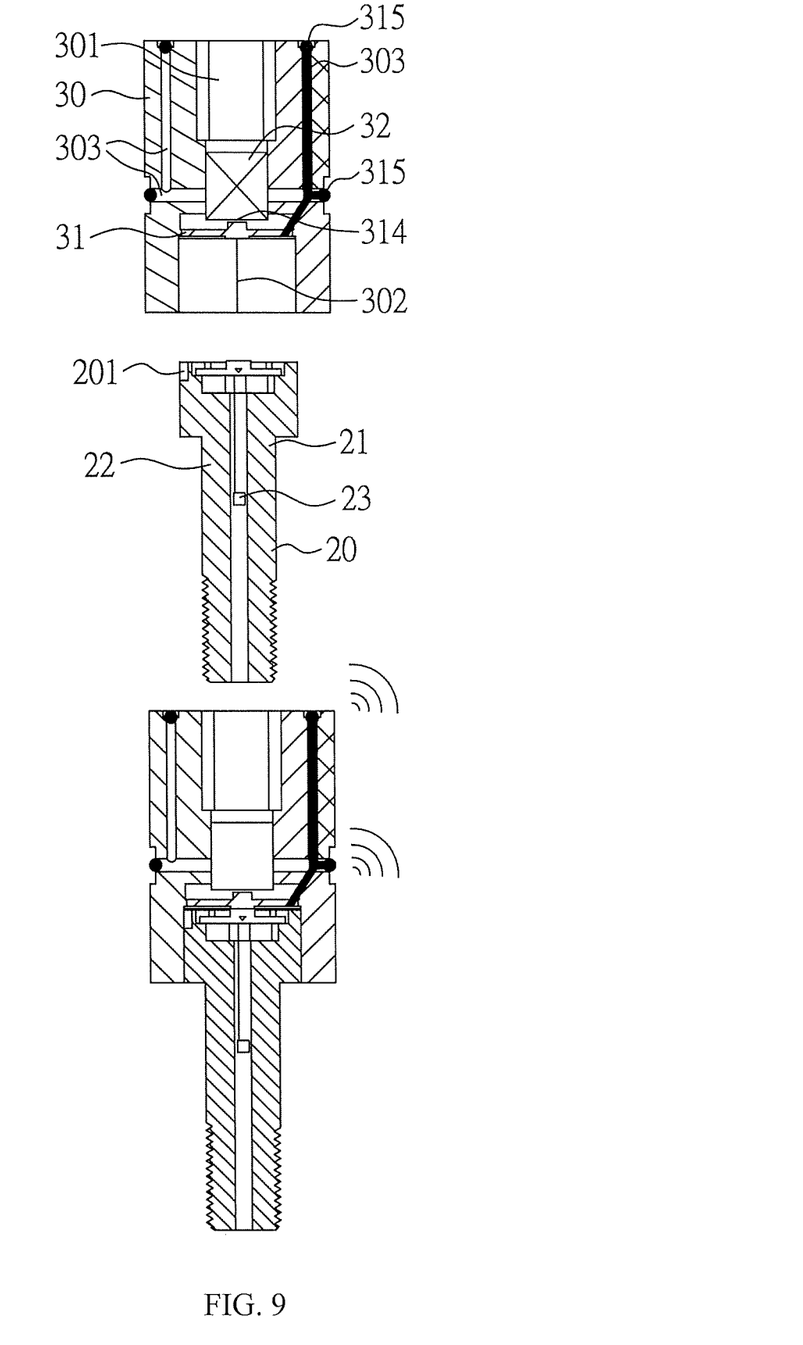
FIG. 9 is a schematic diagram showing a well-known technique of practicing a transmitting socket and a sensing bolt.
Figure 10:
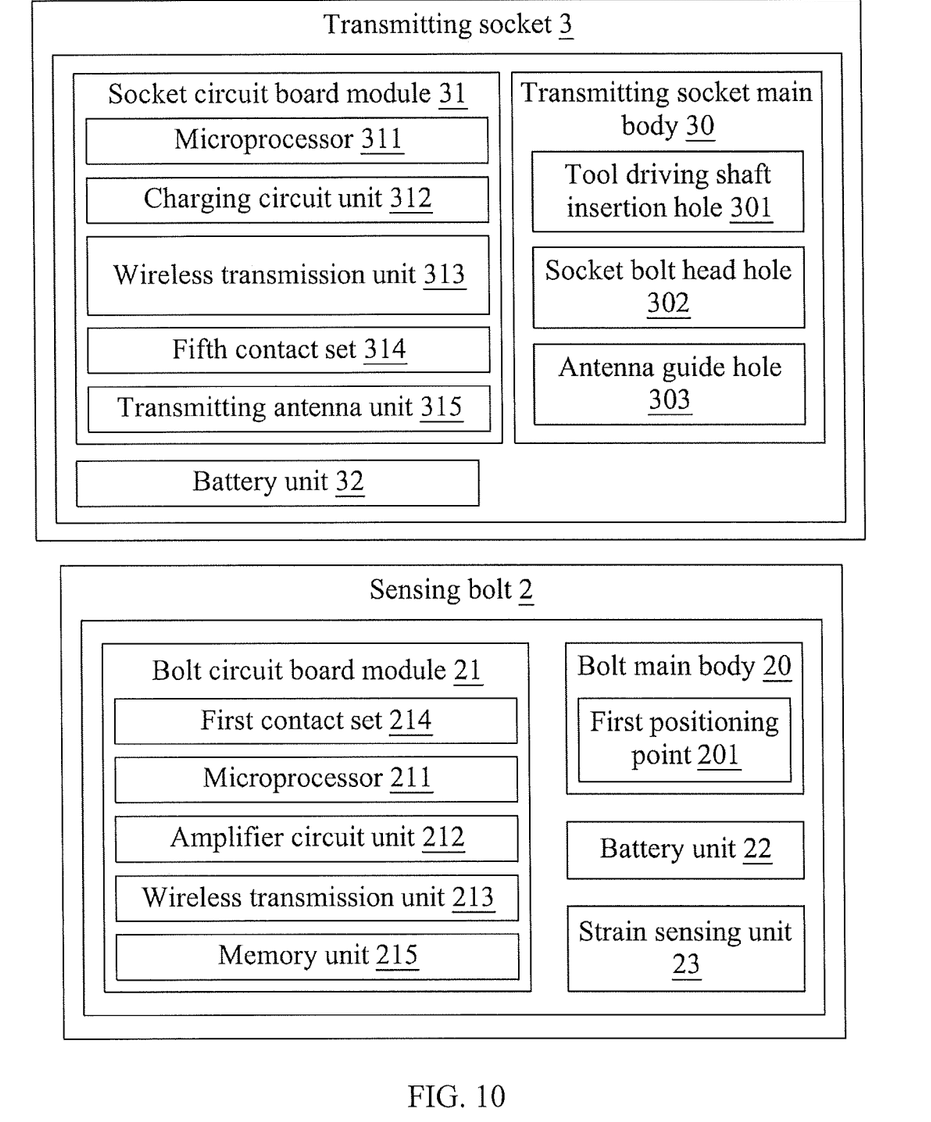
FIG. 10 is a block diagram showing a well-known transmitting socket and sensing bolt.

Most of commercial bolts that include sensing elements (similar to the sensing bolt of the present invention) adopt a wired approach to handle the capture of strain signals and to supply the necessary electrical power persistently, and, limited by its wired structure, the sensing bolt cannot be tightened by the joint of a power tightening tool and a typical bolt socket. Therefore, the inventor of the present invention submitted the patent issued as I454346 and the application no. 105121151. Wherein, the design of the transmitting socket solves the problem in which sensing signals cannot be transmitted to the controller because the wireless signal in the sensing bolt is blocked by the metallic material of the socket during the tightening procedure, as shown in FIGS. 9 and 10, which are an implementation schematic diagram and a block diagram of the transmitting socket and the sensing bolt.

However, the inventor of the present invention finds that the tightened sensing bolts in the inventions of the aforementioned patents still have problems of electrical power which cannot be persistently supplied and sensing signals which cannot be further transmitted. Wherein, the battery included in the sensing bolt has limited capacity because of limited space in the main body of the sensing bolt, and the power was also gradually depleted during long-term storage. Therefore, after years of research, the inventor of the present invention has designed a power supply and signal transmitting device for the sensing bolt and a sensing bolt device to improve the weaknesses of the present technique so as to promote its applicability in the industry. For example, for safety considerations, bolt tightening on a vehicle wheel rim requires not only the control of clamping force on a bolt, but also the continuous monitoring of the tightening status of the bolt.

SUMMARY OF THE INVENTION

In view of the problems of the aforementioned conventional technique, the purpose of the present invention is to provide a power supply and signal transmitting device for a sensing bolt and a sensing bolt device to lessen the encountered problems when applying the aforementioned conventional technique.

For the purpose of the present invention, provided herein is the power supply and signal transmitting device for the sensing bolt, which can be applied on a sensing bolt including a first contact set on one end. The power supply and signal transmitting device for the sensing bolt includes a cap module and a supply module. The cap module is a hollow structure to include a first accommodation space and a second accommodation space, wherein the first accommodation space of the cap module is configured to cap an end of the sensing bolt, and the cap module includes a cap circuit board module, which is disposed at a junction of the first accommodation space and the second accommodation space, and the cap circuit board module includes a second contact set disposed on a surface of the cap circuit board module facing the first accommodation space to electrically contact the first contact set of the sensing bolt, and the cap circuit board module includes a third contact set disposed on a surface of the cap circuit board module facing the second accommodation space. A supply module is disposed in the second accommodation space, wherein the supply module includes a fourth contact set to electrically contact the third contact set of the cap circuit board module. Wherein, the supply module of the power supply and signal transmitting device selectively transmits electrical power to the sensing bolt or accesses information stored in the sensing bolt through the cap module.

Preferably, the supply module is a power supply unit, a power supply and antenna unit, or a power supply and signal connector unit.

Preferably, the supply module, the cap module, and the sensing bolt are fitted together through a thread structure, a grasp structure, or a tight fit structure with the addition of a leak-proof device, and the sensing bolt, the supply module, and the cap module clutch each other through a positioning point included in a main body of each one of the sensing bolt, the supply module, and the cap module.

Preferably, the cap module is made of a material that does not block signal transmission or a metallic material.

Preferably, the cap circuit board module includes a microprocessor, a wireless transmission unit, and a protective circuit unit, and the microprocessor electrically connects the wireless transmission unit, the protective circuit unit, the second contact set, and the third contact set, and the wireless transmission unit is configured to perform wireless signal transmission, and the protective circuit unit is configured to prevent the sensing bolt from being damaged by an overcurrent and to send out an immediate warning if power capacity reaches a predetermined lower limit.

For the purposes of the present invention, a sensing bolt device is also provided, which includes a sensing bolt and a power supply and signal transmitting device. Wherein, the sensing bolt includes a bolt circuit board module, a strain sensing unit, and a battery unit, wherein the bolt circuit board module includes a microprocessor, an amplifier circuit unit, a memory unit, and a first contact set, and the bolt circuit board module electrically connects the battery unit and the strain sensing unit, and the memory unit stores a production history data and a bolting data of the sensing bolt. Wherein, the power supply and signal transmitting device includes a cap module and a supply module, and the cap module is a hollow structure including a first accommodation space and a second accommodation space, wherein the first accommodation space of the cap module is configured to cap an end of the sensing bolt, and the cap module includes a cap circuit board module, which is disposed at a junction of the first accommodation space and the second accommodation space, and the cap circuit board module includes a second contact set disposed on a surface of the cap circuit board module facing the first accommodation space to electrically contact the first contact set, and the cap circuit board module includes a third contact set disposed on a surface of the cap circuit board module facing the second accommodation space, and the supply module is disposed in the second accommodation space and includes a fourth contact set to electrically contact the third contact set. The supply module of the power supply and signal transmitting device transmits electrical power to the sensing bolt or accesses information stored in the sensing bolt through the cap module.

Preferably, the supply module is a power supply unit, a power supply and antenna unit, or a power supply and signal connector unit.

Preferably, the supply module, the cap module, and the sensing bolt are fitted together through a thread structure, a grasp structure, or a tight fit structure with the addition of a leak-proof device, and the sensing bolt and the supply module and the cap module of the power supply and signal transmitting device clutch each other through a positioning point included in a main body of each one of the sensing bolt, the supply module, and the cap module.

Preferably, the sensing bolt device sends the production history data, the bolting data, or a combination thereof through the power supply and signal transmitting device of the sensing bolt device to another power supply and signal transmitting device by means of wireless or wired approach to continue transmission to an external device.

Preferably, the production history data of the sensing bolt includes the relationship curve between the generated strain values and the corresponding clamping force values when torque is applied on the sensing bolt during a verification process.

In summary, the power supply and signal transmitting device for the sensing bolt and the sensing bolt device have the following advantages:

(1) According to the power supply and signal transmitting device for the sensing bolt and the sensing bolt device of the present invention, used with the cap module, the supply module indirectly connects to the sensing bolt for persistently supplying electrical power, thereby solving the power supply problem of the sensing bolt. In addition, the power supply and signal transmitting device for the sensing bolt and the sensing bolt device of the present invention and a peripheral controller access for the information about the bolt by means of a wireless or wired approach and fulfills the purpose of remotely monitoring the tightening status of the bolt by disposing the power supply and signal transmitting devices for every effective transmission distance to transmit in a relay (similar to wireless signal repeaters) over a long distance.

(2) According to the power supply and signal transmitting device for the sensing bolt and the sensing bolt device of the present invention, the supply module and the cap module can be detachably capped on the sensing bolt, and, based on demands, the cap module can selectively mate with various kinds of supply modules such as a power supply unit, a power supply and antenna unit, or a power supply and signal connector unit to improve the persistency of power supply and to fulfill the purpose of real-time bolt sensing signal access and remote monitoring on the bolt tightening status.

(3) According to the power supply and signal transmitting device for the sensing bolt and the sensing bolt device of the present invention, the cap circuit board module further includes a wireless transmission unit such that wireless signal transmission can be achieved when the case of the cap module is made of a material that does not block signal transmission or when the cap module is made of metal but with a guide hole to conduct the antenna to the outside. In addition, a plurality of the power supply and the signal transmitting devices can be disposed for every effective transmission distance to perform transmission in a relay (similar to wireless signal repeaters) over a long distance, such that the purpose of remote monitoring of the tightening status of the bolt can be better achieved.

The technical features of the present invention will be described in detail hereinafter with the help of embodiments and accompanying drawings, so that those having ordinary knowledge in the technical field may easily understand the purposes, technical features, and advantages of the present invention.

DESCRIPTION OF THE PREFERRED EMBODIMENTS

For examiners to better understand the technical features, content, advantage, and effect, the present invention will be presented in detail hereinafter with the help of embodiments and drawings, wherein the purpose of the drawings is to provide assistance to the specification, and the drawings are schematic and do not necessarily imply the actual dimensions or precise configurations of practical implementations of the present invention, and, therefore, the scope of practices of the present invention is not interpreted and limited by the scale and configuration of the drawings.

In the description of the present invention, it should be noted that, unless specified or limited otherwise, the terms "mounted", "connected", "coupled", and "disposed" should be considered as general terms including the meanings such as fixedly coupled, detachably coupled, formed as a single element, mechanical or electrical couplings, inner couplings of two components, direct couplings, or indirect couplings through intermediaries. A person with ordinary skill in the art can understand the specific meanings of the aforementioned terms in the present invention based on specific situations.

In the following embodiments, the technical means such as sensing bolts and transmitting socket, which are exemplarily described in the patent issued as I454346 and in the patent application no. 105121151, are incorporated by full text as a part of the specification of the present invention.

The embodiments of a power supply and signal transmitting device for a sensing bolt and a sensing bolt device will be described with reference to the drawings. For ease of comprehension, similar elements will be designated with the same reference numerals throughout the embodiments.

Figure 1:
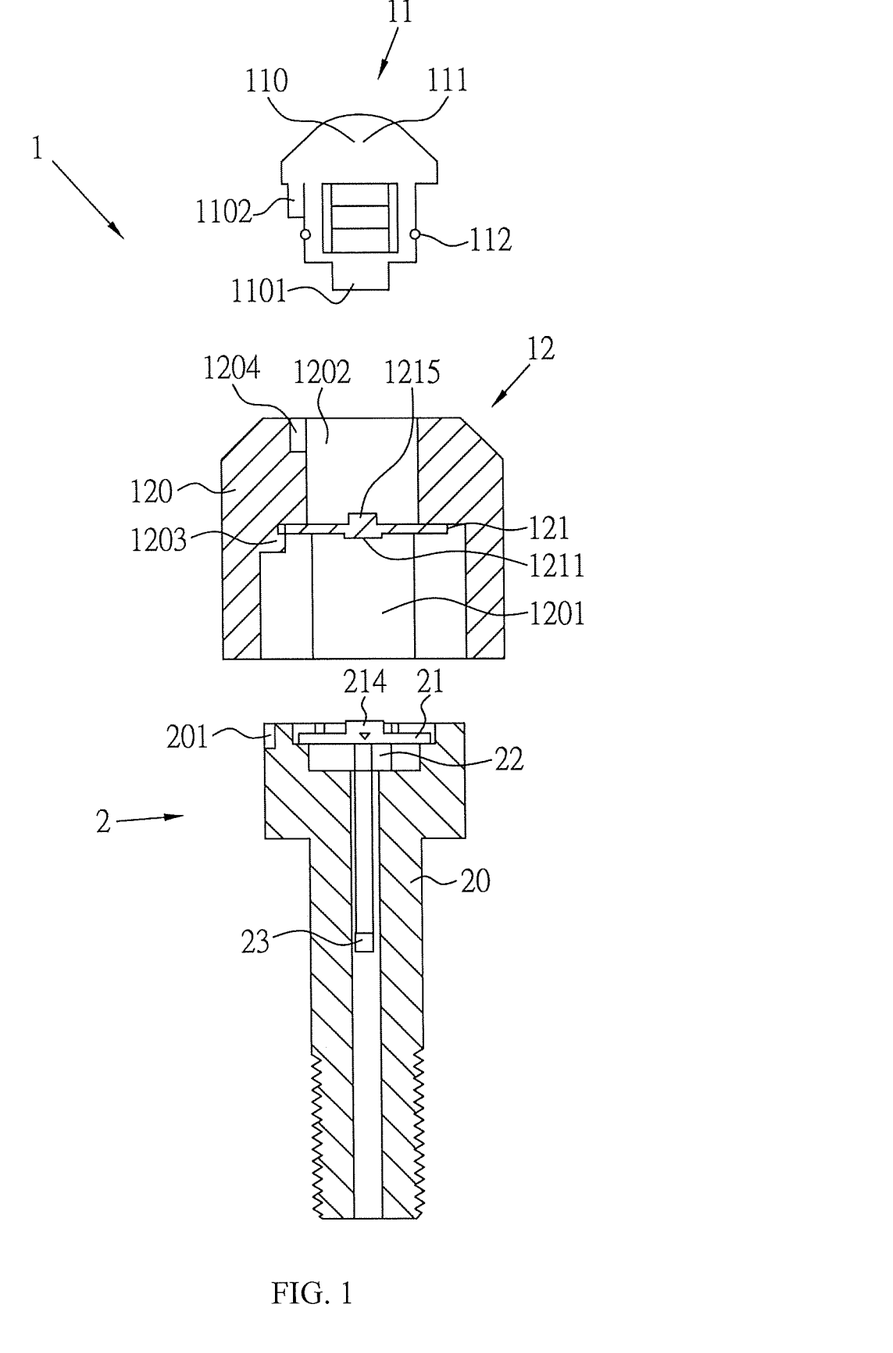
FIG. 1 is a schematic diagram showing an arrangement of a power supply and signal transmitting device and a sensing bolt of the present invention.

The following refers to FIG. 1, which is a schematic diagram showing an arrangement of a power supply and signal transmitting device and a sensing bolt of the present invention. The power supply and signal transmitting device 1 of the present invention is capped to be applied on an end of the sensing bolt 2 and a first contact set 214 of the power supply and signal transmitting device 1. Therefore, the power supply and signal transmitting device 1 is electrically contacting a first contact set 214 on an end of the sensing bolt 2. Thereby, the power supply and signal transmitting device 1 supplies power to and performs signal transmission with the sensing bolt 2 or extends the transmitting range of wireless signals of the sensing bolt 2.

As shown in the figure, the power supply and signal transmitting device 1 of the present invention includes a supply module 11 and a cap module 12. Wherein, the cap module 12 is a hollow structure made of a material that does not block signal transmission such as a plastic material or is made of a metal material such as: Al, Cu, Fe, etc. The present embodiment adopts a material that does not block signal transmission as an exemplary aspect. In an axial cross-section view, the interior of the cap module 12 is of stepped shape and, thereby, includes a first accommodation space 1201 and a second accommodation space 1202. The cap module 12 includes a cap circuit board module 121 disposed at the junction of the first accommodation space 1201 and the second accommodation space 1202 or disposed at the top of the first accommodation space 1201, wherein the first accommodation space 1201 of the cap module 12 is used to cap an end of the sensing bolt 2. A second contact set 1211 is disposed on a surface of the cap circuit board module 121 facing the first accommodation space 1201 to the electrical contact the first contact set 214 of the sensing bolt 2. In addition, a third contact set 1215 is disposed on a surface of the cap circuit board module 121 facing the second accommodation space 1202.

In another aspect, the supply module 11 is disposed in the second accommodation space 1202, preferably, through a measure such as a grasp measure, a thread structure, a tight fit measure, a leak-proof device 112, etc. The present embodiment adopts, but is not limited to, the tight fit measure as an exemplary aspect. As for the configurations of grasp measure and thread structure, they are already well known by one skilled in the art and, therefore, require no further description. Wherein, the supply module 11 includes a power supply unit 111 and a fourth contact set 1101 to electrically contact the third contact set 1215. Likewise, the cap module 12 is capped to an end of the sensing bolt 2 through a grasp measure, a thread structure, a tight fit measure, or a leak-proof device 112. The present embodiment adopts, but is not limited to, the tight fit measure as an exemplary aspect. As for the configurations of grasp measure and thread structure, they are already well known by one skilled in the art and, therefore, require no further description.

Figure 2:
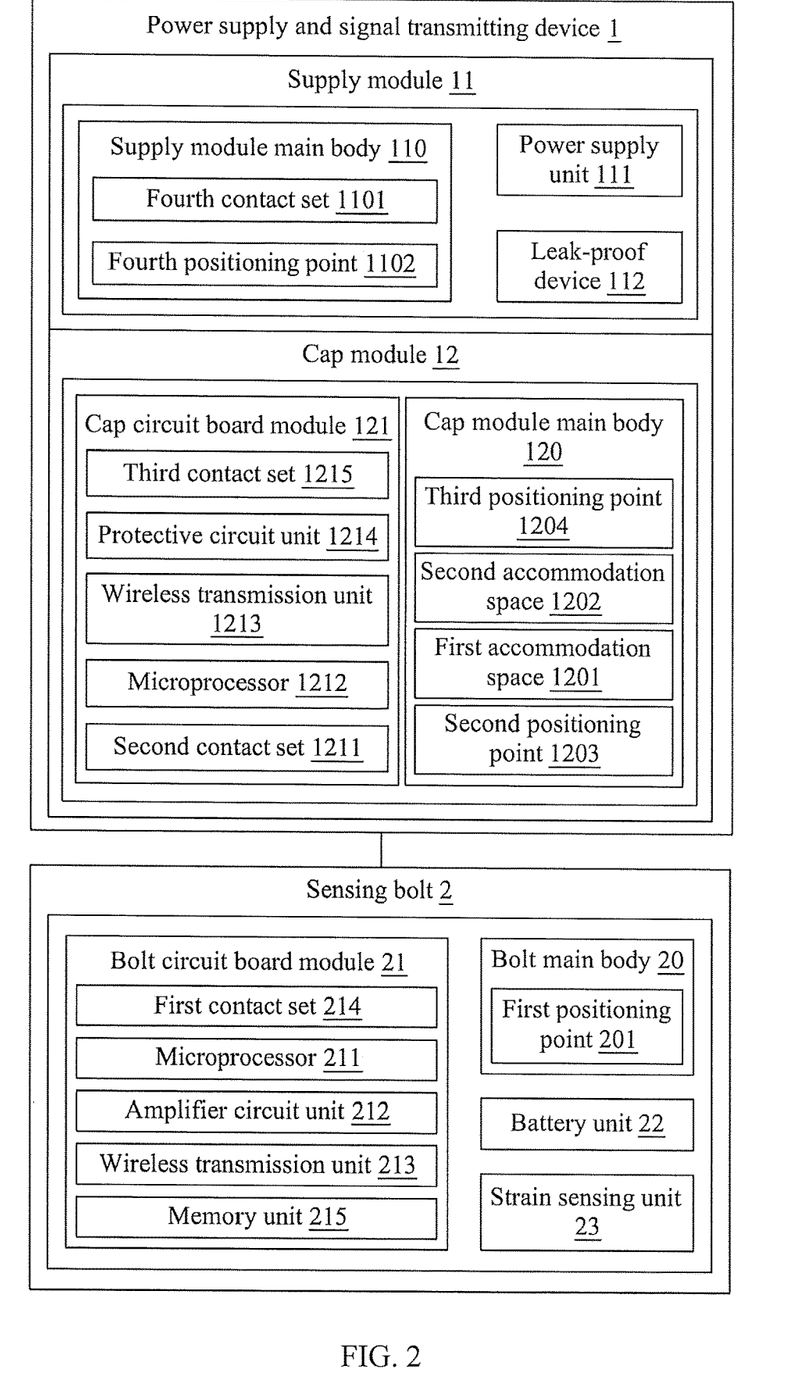
FIG. 2 is a block diagram showing a power supply and signal transmitting device and a sensing bolt of the present invention.

The following also refers to FIG. 2, which is a block diagram showing a power supply and signal transmitting device and a sensing bolt of the present invention. As shown in the figures, the cap circuit board module 121 includes a microprocessor 1212, a wireless transmission unit 1213, and a protective circuit unit 1214. Wherein, the microprocessor 1212 electrically connects the wireless transmission unit 1213, the protective circuit unit 1214, the second contact set 1211, and the third contact set 1215. The wireless transmission unit 1213 is configured to perform wireless signal transmission. After the power supply and signal transmitting device 1 is coupled to the sensing bolt 2, the power supply and signal transmitting device 1 accesses the sensing bolt 2 for information and perform wireless transmission. The protective circuit unit 1214 is configured to prevent the sensing bolt 2 from being damaging from overcurrent from the supply module 11 and to send out an immediate warning if power capacity reaches a predetermined lower limit.

In the power supply and signal transmitting device 1 of the present invention as shown in the figures, the power supply unit 111 of the supply module 11 transmits the power to the sensing bolt 2 through the fourth contact set 1101 of a supply module main body 110 and the third contact set 1215 of the cap circuit board module 121 in order to continuously supply electric power. The leak-proof device 112 prevents anomalies from entering the second accommodation space 1202 and damaging the cap circuit board module 121.

Figure 3:
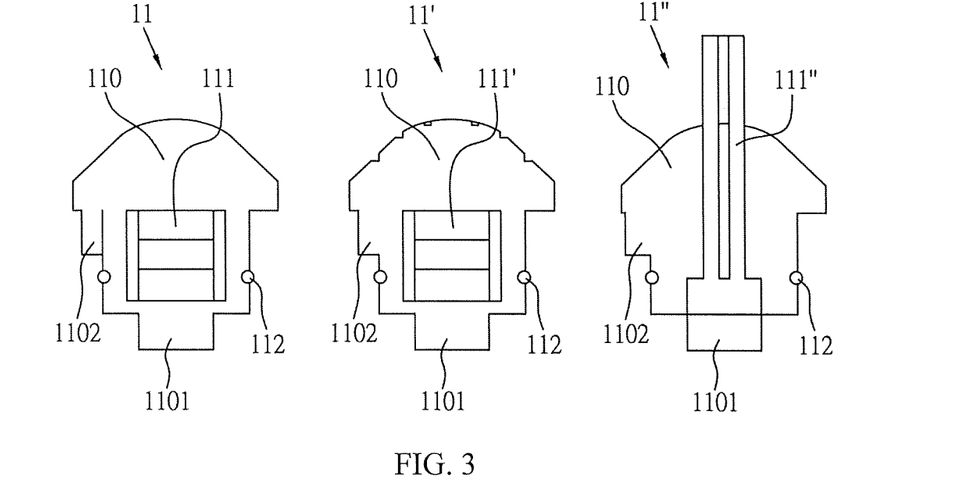
FIG. 3 is a schematic diagram showing an embodiment of a supply module of a power supply and signal transmitting device of the present invention.
Figure 4:
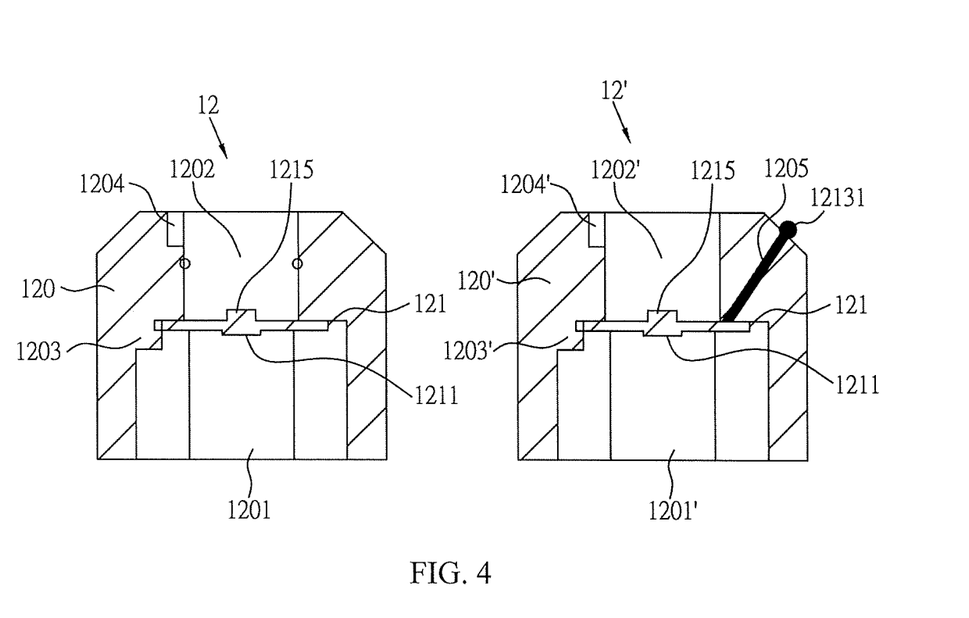
FIG. 4 is a schematic diagram showing an embodiment of a cap module of a power supply and signal transmitting device of the present invention.

It should be noted that there are a variety of supply module implementations of the power supply and signal transmitting device 1 as shown in FIG. 3 and FIG. 4. The supply module 11' in another embodiment is a power supply and antenna unit 111' and is adopted and transmits signals through a built in antenna when the metallic cap main body 120' blocks signal transmission. The supply module 11" in another embodiment is a power supply and signal connector unit 111" and is adopted when the metallic cap main body 120' blocks signal transmission or is adopted to transmit power and signals by using the built in power supply and signal connector unit through a cable when a wired approach to introduce external power is required.

The following refers to FIG. 4, which is a schematic diagram showing an embodiment of a cap module of a power supply and signal transmitting device of the present invention. As shown in the figure, a cap main body 120 of the cap module 12 is made of a material that does not block signal transmission, and a third positioning point 1204 clutches a fourth positioning point 1102 of the supply module main body 110, and a second positioning point 1203 clutches a first positioning point 201 of a sensing bolt main body 20. In a metallic cap main body 120' of another metallic cap module 12', an antenna 12131 extends from the wireless transmission unit 1213 of the cap circuit board module 121 to the outside of the metallic cap main body 120' through a guide hole 1205 for wireless signal transmission. In the metallic cap module 12', a third positioning point 1204' of the metallic cap main body 120' is used to clutch the fourth positioning point 1102 of the supply module main body 110, and a second positioning point 1203' is used to clutch the first positioning point 201 of the sensing bolt main body 20.

Therefore, when the first accommodation space 1201 of the cap module 12 caps an end of the sensing bolt 2, the first contact set 214 of the sensing bolt 2 electrically contacts the second contact set 1211 of the cap circuit board module 121, and the third contact set 1215 of the cap circuit board module 121 electrically contacts the fourth contact set 1101 of the supply module 11, thereby electrically connecting the supply module 11 and the sensing bolt 2 to provide the external power to the sensing bolt 2 or to access the sensing bolt 2 for the stored data. For adapting units with different functions, the fourth contact set 1101 of the supply module 11 can, for example, extend to the outside of the supply module 11 including power supplies and signal connector units such that the contact set may be designed to include all functions of power supply, antenna usage, and signal transfer as desired.

Figure 5:
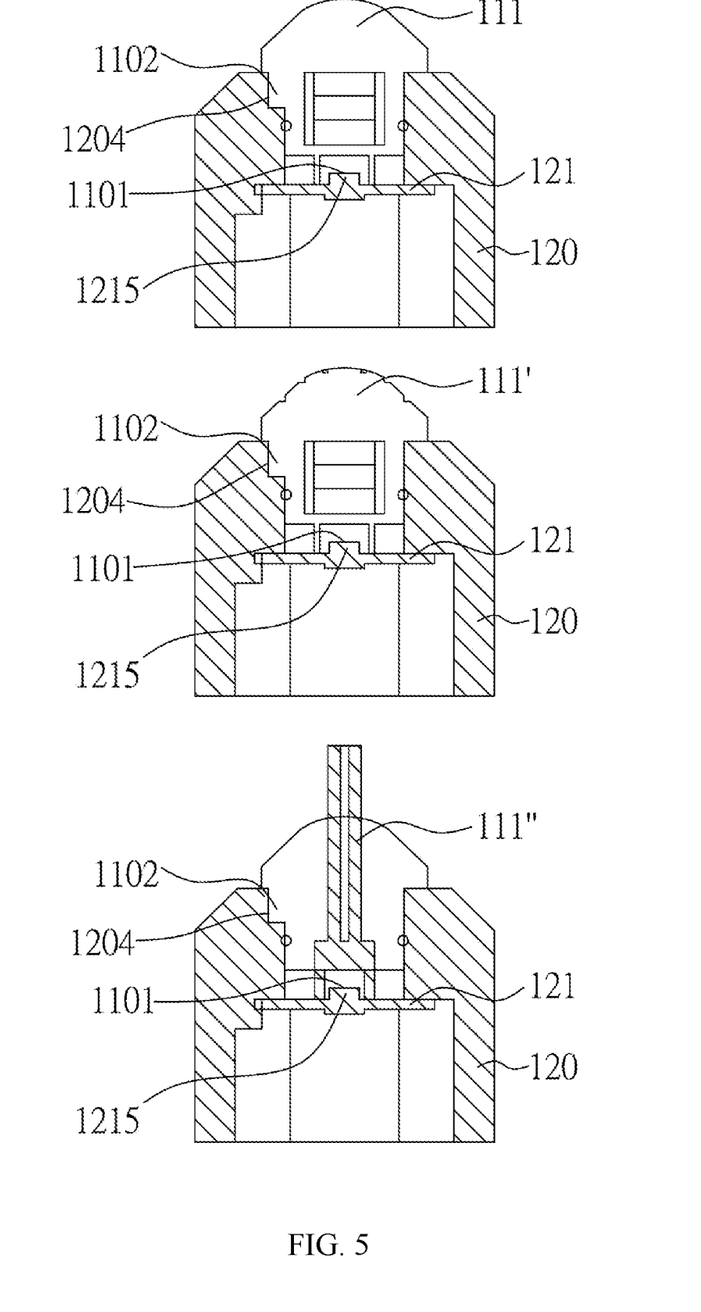
FIG. 5 is a schematic diagram showing an embodiment of an assembly of a supply module and a cap module of a power supply and signal transmitting device of the present invention.
Figure 6:
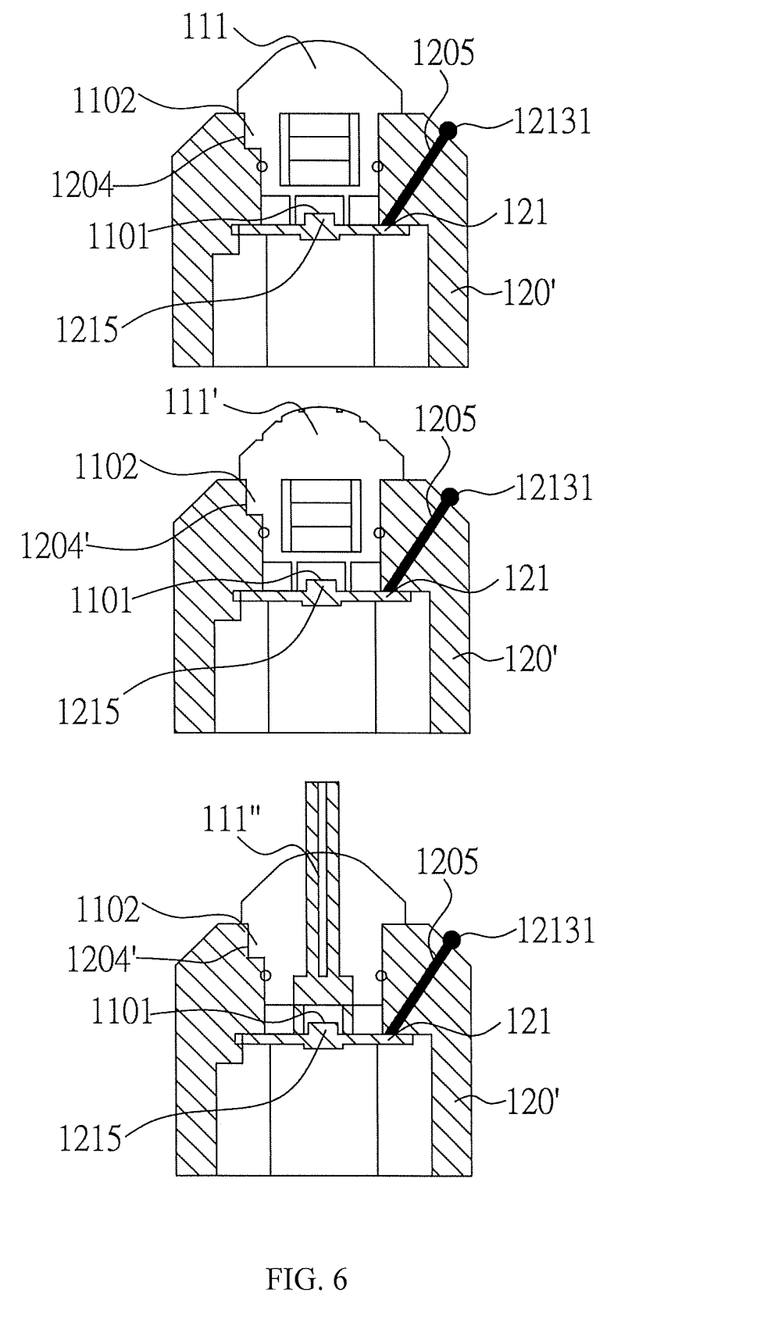
FIG. 6 is a schematic diagram showing another embodiment of an assembly of a supply module and a cap module of a power supply and signal transmitting device of the present invention.

The following also referring to FIG. 5 and FIG. 6, which are schematic diagrams showing embodiments of various assemblies of a supply module and a cap module of a power supply and signal transmitting device of the present invention. The structure of the power supply and signal transmitting device of the present invention are chosen to be used in different applications having different functions. As shown in the figures, the supply module is a power supply unit 111, a power supply and antenna unit 111', or a power supply and signal connector unit 111" for pairing with the cap module main body 120 is made of a material that does not block signal transmission, wherein the fourth positioning point 1102 of the supply module clutches the third positioning point 1204 of the cap main body 120 is made of a material that does not block signal transmission, and the fourth contact set 1101 of the supply module 11 electrically contacts the third contact set 1215 of the cap circuit board module 121 to facilitate the assembly. The supply module 11 is also paired with the cap main body 120' and is made of a metallic material. In this case, the metallic cap main body 120' needs the guide hole 1205 to allow the antenna 12131 to extend from the wireless transmission unit 1213 of the cap circuit board module 121 to the outside of the metallic cap main body 120' for wireless signal transmission. The fourth positioning point 1102 of the supply module 11 clutches the third positioning point 1204' of the metallic cap main body 120' of the metallic cap module 12', and the fourth contact set 1101 of the supply module 11 electrically contacts the third contact set 1215 of the cap circuit board module 121. Wherein, the positioning points clutch each other relatively to facilitate the assembly process and avoid misplacement.

Figure 7:
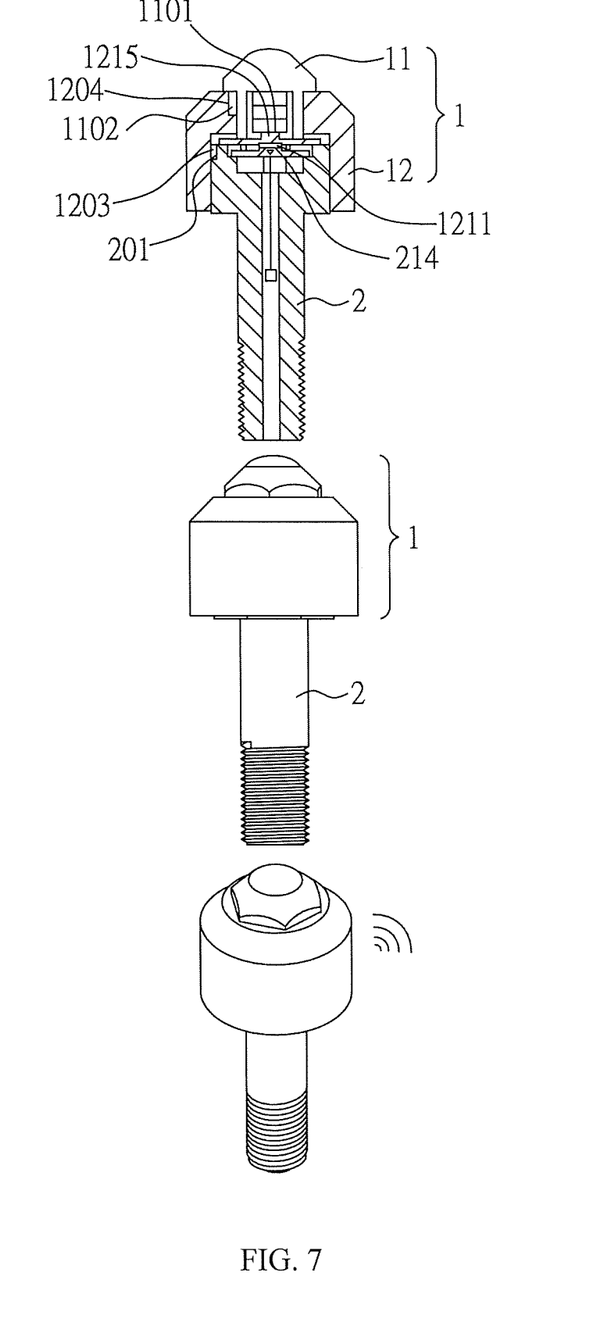
FIG. 7 is a schematic diagram showing a structure of fitting a power supply and signal transmitting device and a sensing bolt.

The following also refers to FIG. 2 and FIG. 7, which are a block diagram showing a power supply and signal transmitting device 1 and a sensing bolt 2 and a fitting structure schematic diagram thereof. As shown in the figures, the bolt main body 20 of the sensing bolt 2 includes the first positioning point 201. Wherein, a bolt circuit board module 21 includes a microprocessor 211, an amplifier circuit unit 212, a wireless transmission unit 213, a memory unit 215, and the first contact set 214, wherein the bolt circuit board module 21 electrically connects a battery unit 22 and a strain sensing unit 23. When fastening the sensing bolt 2, the strain sensing signal of the strain generated during the torque stretching the sensing bolt 2 is sent by the strain sensing unit 23 to the amplifier circuit unit 212 for amplification and, then, to the microprocessor 211 and is used for calculating the clamping force. Wherein, the power supply and signal transmitting device 1, as aforementioned, includes the supply module 11, which includes the power supply unit 111, and the cap module 12. When the power supply and signal transmitting device 1 caps the sensing bolt 2, the second positioning point 1203 of the cap main body 120 of the cap module 12 clutches the first positioning point 201 of the main body 20 of the sensing bolt 2, and the second contact set 1211 of the cap circuit board module 121 electrically contacts the first contact set 214 of the bolt circuit board module 21, and the sensing bolt 2 is continuously supplied with electrical power by the power supply unit 111 of the supply module 11 through the third contact set 1215 and the second contact set 1211 of the cap circuit board module 121. The memory unit 215 of the bolt circuit board module 21 stores the production history associated with the sensing bolt 2 such as the manufacturer code, the batch production record, the material of the bolt, the grade of the bolt, the allowable tightening torque value, the strain value and corresponding clamping force, and the identification code of the bolt, and stores the bolting information such as the bolting time, the bolting person ID, the torque value applied, the clamping force actually generated, or a combination thereof, and the bolting information is sent to a peripheral controller or a receiving device through the wireless transmission unit 213 of the bolt circuit board module 21 for information access. Due to limited transmission ability and effective range, the wireless transmission unit 1213 of the cap circuit board module 121 can adapt a relay function in the signal transmission. In addition, the production history data of the sensing bolt 2 includes the relationship curve between the generated strain values and the corresponding clamping force values when torque is applied on the sensing bolt during a verification process.

Figure 8:
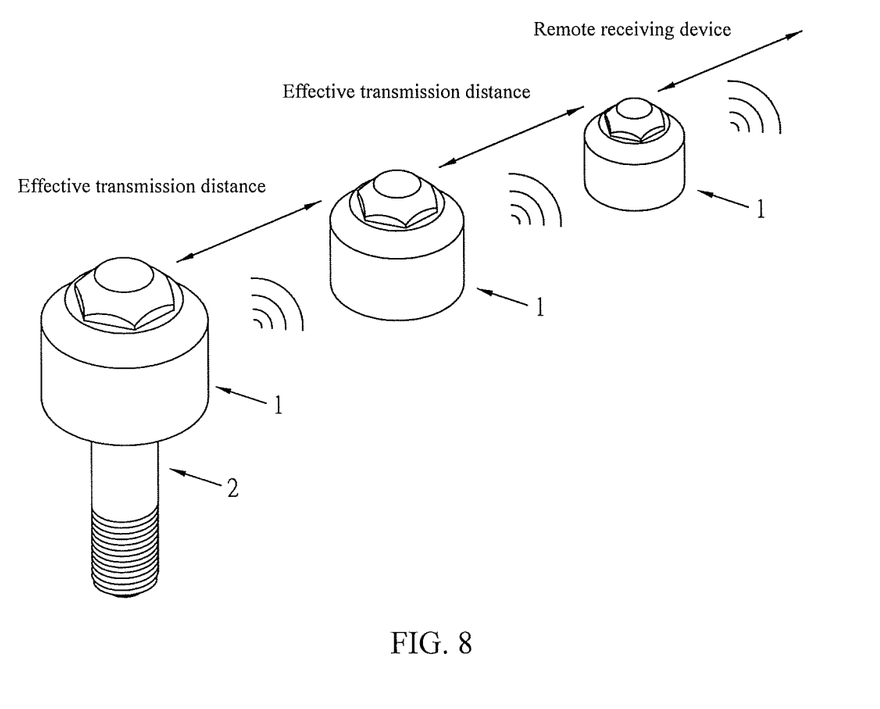
FIG. 8 is a schematic diagram showing an application of a power supply and signal transmitting device and a sensing bolt.

The following also refers to FIG. 8, which illustrates combination applications of power supply and signal transmitting devices 1 and sensing bolts 2, wherein the tightening statuses of the sensing bolts is sent to a further receiving device or processor by the power supply and signal transmitting devices 1, each of which is installed for every effective distance (15 m to 20 m), and the safety of structures of equipment is then viewed through the remote monitoring via network, e.g. the force control during tightening the bolt on a vehicle rim and real-time monitoring of a driving vehicle, or the tightening force control, manufacturing control, and continuously tightening status monitoring of a high-speed railway, a bridge, or a high pressure vessel. In other words, the sensing bolt device sends the production history data, the bolting data, or a combination thereof through the power supply and signal transmitting device 1 of the sensing bolt device to another power supply and signal transmitting device 1 by means of wireless or wired approach to continue transmission to an external device.

It should be noted that, based on practical demands, after tightening the sensing bolt and capping the transmission cap, the transmission distance can be 1000 m to 2000 m or further by using a high power transmission cap to replace the arrangement of multiple transmission caps if a long distance signal transmission is required for the present invention. This can help facilitate the management of the necessary processes or information obtained by the present invention.

The combination of the power supply and signal transmitting device 1 and the sensing bolt 2 is mainly provided to solve the practical problems of continuous power supply and long distance transmitting and monitoring of sensing signals in the patent issued as I454346 and in the patent application no. 105121151 as submitted by the inventor. The following also refers to FIG. 9 and FIG. 10. Wherein, the design of a transmitting socket 3 offers a wireless transmission measure of sensing signals of the bolt during the tightening of the sensing bolt 2 by guiding a transmitting antenna unit 315 that connects a wireless transmission unit 313 included in a socket circuit board module 31 to the outside of the case of the transmitting socket 3 through an antenna guide hole 303, thereby solving the problem of signal being blocked by the metallic material, and the previous elements are supplied with electrical power by a battery unit 32 of the transmitting socket 3. One end of the main body of the transmitting socket 3 is a tool driving shaft insertion hole 301 for the driving shaft of a torque tool, and the other end is a socket bolt head hole 302 for receiving the head of a bolt so as to fasten the bolt. When a target clamping force is reached, a control device immediately cuts off the power and sends a warning and stores the bolting data such as the final value of the clamping force, the operator ID, and the operational time in the memory unit 215 of the bolt circuit board module 21 of the sensing bolt 2 or in the built in EEPROM memory of the microprocessor 211, in a way so the data will not be lost because of a power shutdown and can be used for later tracking and auditing or for continuous real-time monitoring of the tightening status of the bolt. Because the battery unit 22 of the sensing bolt 2 has a limited power capacity and does not persistently provide electrical power to the tightened sensing bolt 2 for continuously transmitting sensing signals, after the operator completes the bolting operation and removes the transmitting socket 3, it is necessary to cap the power supply and signal transmitting device 1 on the sensing bolt 2 so as to provide electrical power to the sensing bolt 2 and to continuously monitor the tightening status of the sensing bolt 2 by means of a wireless or wired approach. While the sensing bolt 2 is persistently supplied with power by the power supply and signal transmitting device 1, the bolt circuit board module 21 periodically transmits the clamping force sensing signal of the bolt to the receiving device through wireless transmission unit 213 according to a preset time interval. Limited by the power supply capability and power transmission efficiency, the wireless transmission unit 213 of the sensing bolt 2 or the wireless transmission unit 313 of the power supply and signal transmitting device 1 that caps the tightened sensing bolt 2 has its effective transmission distance around 15 m to 20 m. In addition to supply external power to the sensing bolt 2, the power supply and signal transmitting device 1 can promptly send sensing signals such as the clamping force to a peripheral server via a wired measure or send sensing signals of the sensing bolt 2 to the wireless transmission unit 1213 of another power supply and signal transmitting device 1 disposed within the effective transmission distance or send sensing signals through a plurality of power supply and signal transmitting devices 1 (similar to wireless signal repeaters) in relay for long distance transmission so as to fulfill the purpose of remotely monitoring the tightening status of the bolt, and the sensing signals can even be transmitted for a long distance by the power supply and signal transmitting device 1 to reach a network or even a cloud server.

In addition, one skilled in the art can clearly understand that the processing procedures such as decision making or controlling can be carried out, preferably in most situations, by using software with necessary common hardware or solely by using hardware. For example, the hardware can be a computing device including a CPU jointly working with a HDD (hard disk drive) or a memory (RAM or ROM) storing a related software.

The description above is only for the purpose of illustration but not restriction. Without departing from the spirit of the present application, any equivalent modification or alteration should be considered as falling within the protection scope of the appended claims.

What is claimed is:

1. A sensing bolt device, comprising:
   a sensing bolt comprising a bolt circuit board module, a strain sensing unit, and a battery unit, wherein the bolt circuit board module comprising a microprocessor, an amplifier circuit unit, a memory unit, and a first contact set, and the bolt circuit board module electrically connects the battery unit and the strain sensing unit, and the memory unit stores a production history data and a bolting data of the sensing bolt;
   a power supply and signal transmitting device comprising:
   a cap module being a hollow structure to include a first accommodation space and a second accommodation space, wherein the first accommodation space of the cap module is configured to cap an end of the sensing bolt, and the cap module comprises a cap circuit board module, which is disposed at a junction of the first accommodation space and the second accommodation space, and the cap circuit board module includes a second contact set disposed on a surface of the cap circuit board module facing the first accommodation space to electrically contact the first contact set of the sensing bolt, and the cap circuit board module comprises a third contact set disposed on a surface of the cap circuit board module facing the second accommodation space;
   a supply module disposed in the second accommodation space, wherein the supply module comprises a fourth contact set used to contact the third contact set;
   wherein the supply module of the power supply and signal transmitting device selectively transmits electrical power to the sensing bolt or accesses information stored in the sensing bolt through the cap module.

2. The sensing bolt device of claim 1, wherein the supply module comprises a power supply unit, a power supply and antenna unit, or a power supply and signal connector unit.

3. The sensing bolt device of claim 1, wherein, the supply module, the cap module, and the sensing bolt are fitted together through a thread structure, a grasp structure, or a tight fit structure with the addition of a leak-proof device, and the sensing bolt, and the supply module and the cap module of the power supply and signal transmitting device clutch each other through a positioning point included in a main body of each one of the sensing bolt, the supply module, and the cap module.

4. The sensing bolt device of claim 1, wherein the cap module is made of a material that does not block signal transmission or a metallic material.

5. The sensing bolt device of claim 1, wherein the sensing bolt device sends the production history data, the bolting data, or a combination thereof through the power supply and signal transmitting device of the sensing bolt device to another power supply and signal transmitting device by means of wireless or wired approach to continue transmission to an external device.

6. The sensing bolt device of claim 1, wherein the production history data of the sensing bolt comprises a relationship curve between the generated strain values and the corresponding clamping force values when torque is applied on the sensing bolt during a verification process.

* * * * *